US006378900B1

(12) United States Patent
Stanley et al.

(10) Patent No.: US 6,378,900 B1
(45) Date of Patent: Apr. 30, 2002

(54) OCCUPANT DETECTION SYSTEM

(75) Inventors: James G. Stanley, Novi; Robert A. Stopper, Jr., Plymouth; Judson G. McDonnell, Farmington Hills, all of MI (US)

(73) Assignee: Automotive Systems Laboratory, Inc., Farmington Hills, MI (US)

( * ) Notice: Subject to any disclaimer, the term of this patent is extended or adjusted under 35 U.S.C. 154(b) by 0 days.

(21) Appl. No.: 09/568,596

(22) Filed: May 10, 2000

Related U.S. Application Data

(60) Provisional application No. 60/133,632, filed on May 11, 1999, provisional application No. 60/133,630, filed on May 11, 1999, provisional application No. 60/143,761, filed on Jul. 12, 1999, and provisional application No. 60/144,161, filed on Jul. 18, 1999.

(51) Int. Cl.$^7$ .............................................. B60R 21/32
(52) U.S. Cl. ........................................ 280/735; 701/45
(58) Field of Search .......................... 280/735; 180/272, 180/273; 701/45

(56) References Cited

U.S. PATENT DOCUMENTS

| | | | |
|---|---|---|---|
| 3,111,608 A | 11/1963 | Boenning et al. ........... 361/179 |
| 3,177,481 A | 4/1965 | Joy et al. ................ 246/167 R |
| 3,237,105 A | 2/1966 | Kalmus ...................... 340/562 |
| 3,324,848 A | 6/1967 | Domeier et al. ............ 600/535 |
| 3,439,358 A | 4/1969 | Salmons ..................... 340/552 |
| 3,740,567 A | 6/1973 | Atkins .................... 307/10 SB |
| 3,806,867 A | 4/1974 | Quantz .................... 340/52 E |
| 3,898,472 A | 8/1975 | Long ..................... 307/10 SB |
| 3,943,376 A | 3/1976 | Long ......................... 307/116 |
| 4,300,116 A | 11/1981 | Stahovec .................... 340/32 |
| 4,430,645 A | 2/1984 | Eskandry et al. ........... 340/572 |
| 4,796,013 A | 1/1989 | Yasuda et al. .............. 340/562 |
| 4,831,279 A | 5/1989 | Ingraham ................... 307/116 |
| 4,887,024 A | 12/1989 | Sugiyama et al. .......... 324/674 |

(List continued on next page.)

OTHER PUBLICATIONS

Fink, Donald G. and Beaty, H. W.; Standard Handbook for Electrical Engineers 12th ed., McGraw–Hill Book Co, 1987, pp. 3–57 through 3–65.

Smith, J.R.; "Field Mice: Extracting hand geometry from electric field measurements", IBM Systems Journal, vol. 35. Nos. 3&4, 1996.

Reference Data for Engineers: Radio, Electronics, Computer, and Communications 7th edition, E.C. Jordon editor in chief, Howard W. Sams, 1985, pp. 12–3 through 12–12.

Jinno K.; Ofuji, M.; Saito, T.; Sekido, S.; "Occupant Sensing Utilizing Perturbation of Electric Fields", SAE 971051, Reprinted from: Anthropomorphic Dummies and Crash Instrumentation Sensors (SP–1261), SAE International Congress & Exposition, Detroit, MI Feb. 24–27, 1997.

H. Philipp, "The Charge Transfer Sensor", Sensors magazine, Nov., 1996.

*Primary Examiner*—Lanna Mai
*Assistant Examiner*—Ruth Ilan
(74) *Attorney, Agent, or Firm*—Dinnin & Dunn P.C.

(57) ABSTRACT

A first electric field sensor in a seat bottom identifies whether there is normally seated, forward facing occupant on a vehicle seat by generating an electric field and sensing the effect of proximate objects thereupon. A second electric field sensor determines if an object is within an at-risk zone proximate to a safety restraint system by sensing from a proximate location the electric field generated by the first electric field sensor, and is responsive to the degree to which an object detected in the at-risk zone is electrostatically coupled to the vehicle seat. A range/proximity sensor may be provided to measure the proximity of an occupant to the seat back, so as to accommodate occupant movement prior to the deployment of the safety restraint system, and to improve occupant discrimination.

34 Claims, 7 Drawing Sheets

U.S. PATENT DOCUMENTS

| | | | |
|---|---|---|---|
| 4,980,519 A | 12/1990 | Mathews | 178/19 |
| 5,071,160 A | 12/1991 | White et al. | 280/735 |
| 5,118,134 A | 6/1992 | Mattes et al. | 280/735 |
| 5,166,679 A | 11/1992 | Vranish et al. | 340/870.37 |
| 5,177,445 A | 1/1993 | Cross | 324/637 |
| 5,214,388 A | 5/1993 | Vranish et al. | 324/683 |
| 5,247,261 A | 9/1993 | Gershenfeld | 324/716 |
| 5,247,281 A | 9/1993 | Facon et al. | 340/562 |
| 5,363,051 A | 11/1994 | Jenstrom et al. | 324/661 |
| 5,442,347 A | 8/1995 | Vranish | 340/870.37 |
| 5,446,391 A | 8/1995 | Aoki et al. | 324/661 |
| 5,494,311 A | 2/1996 | Blackburn et al. | 280/735 |
| 5,525,843 A | 6/1996 | Höwing | 307/9.1 |
| 5,539,292 A | 7/1996 | Vranish | 318/568.21 |
| 5,602,734 A | 2/1997 | Kithil | 364/424.055 |
| 5,624,132 A | 4/1997 | Blackburn et al. | 280/735 |
| 5,626,359 A | 5/1997 | Steffens, Jr. et al. | 280/735 |
| 5,691,693 A | 11/1997 | Kithil | 340/439 |
| 5,722,686 A | 3/1998 | Blackburn et al. | 280/735 |
| 5,724,024 A | 3/1998 | Sonderegger et al. | 340/562 |
| 5,730,165 A | 3/1998 | Philipp | 137/1 |
| 5,770,997 A | 6/1998 | Kleinberg et al. | 340/438 |
| 5,793,176 A | 8/1998 | Novak | 318/587 |
| 5,802,479 A | 9/1998 | Kithill et al. | 701/45 |
| 5,844,415 A | 12/1998 | Gershenfeld et al. | 324/663 |
| 5,844,486 A | 12/1998 | Kithil et al. | 340/573 |
| 5,848,661 A | 12/1998 | Fu | 180/273 |
| 5,871,232 A | 2/1999 | White | 280/735 |
| 5,883,591 A | 3/1999 | McEwan | 342/22 |
| 5,914,610 A | 6/1999 | Gershenfeld et al. | 324/663 |
| 5,948,031 A | 9/1999 | Jinno et al. | 701/45 |
| 5,964,478 A | 10/1999 | Stanley et al. | 280/735 |
| 6,014,602 A | 1/2000 | Kithil et al. | 701/45 |
| 6,031,380 A | 2/2000 | Gleixner et al. | 324/683 |
| 6,043,743 A | 3/2000 | Saito et al. | 340/562 |
| 6,079,738 A | 6/2000 | Lotito et al. | 280/735 |
| 6,094,610 A | 7/2000 | Steffens, Jr. et al. | 701/45 |
| 6,158,768 A | 12/2000 | Steffens, Jr. et al. | 280/735 |
| 6,186,538 B1 | 2/2001 | Hamada et al. | 280/735 |

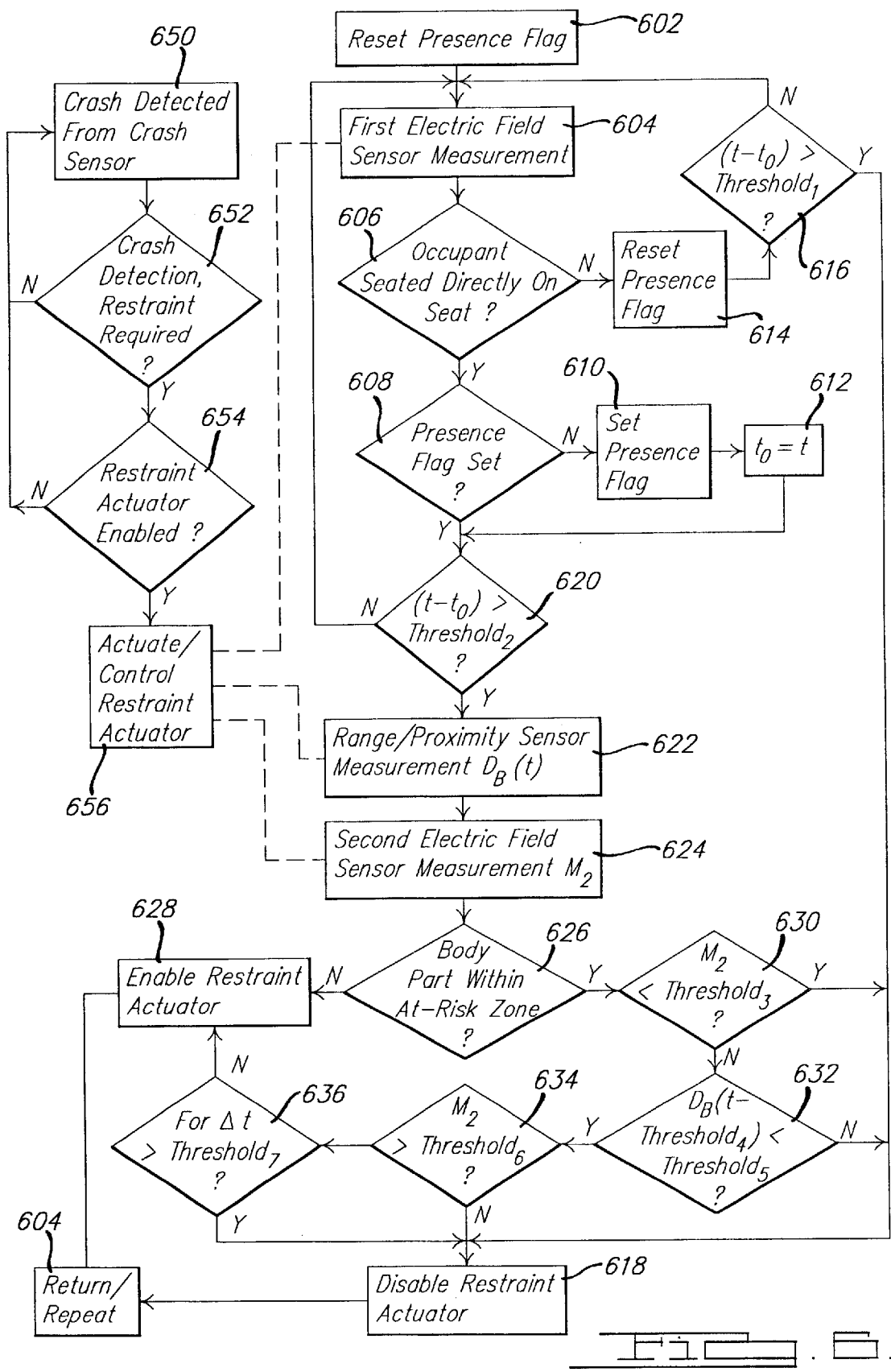

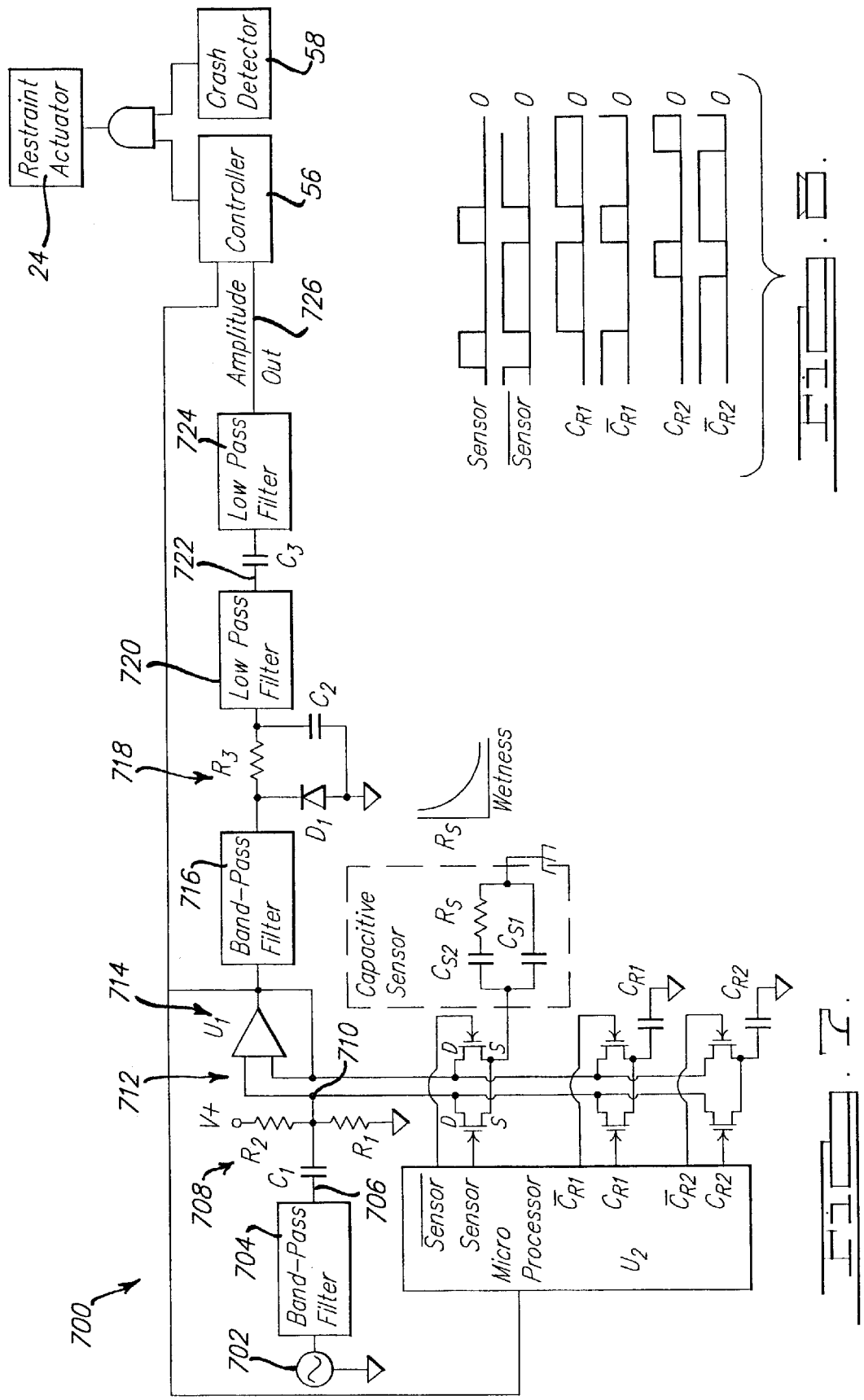

OCCUPANT DETECTION SYSTEM

The instant application claims the benefit of the following prior U.S. provisional applications: U.S. Provisional Application Ser. No. 60/133,632 filed on May 11, 1999; U.S. Provisional Application Ser. No. 60/133,630 filed on May 11, 1999; U.S. Provisional Application Ser. No. 60/143,761 filed on Jul. 12, 1999; and U.S. Provisional Application Ser. No. 60/144,161 filed on Jul. 18, 1999.

The following co-pending, commonly owned U.S. applications also disclose occupant detection systems or occupant sensors: U.S. application Ser. No. 09/294,752 entitled Occupant Detection System, filed on Apr. 19, 1999; U.S. application Ser. No. 09/294,675 entitled Occupant Detection System, filed on Apr. 19, 1999; U.S. application Ser. No. 09/294,680 entitled Occupant Detection System, filed on Apr. 19, 1999; U.S. application Ser. No. 09/474,600 entitled Occupant Detection System, filed on Dec. 29, 1999; U.S. application Ser. No. 09/474,470, entitled Occupant Detection System, filed on Dec. 29, 1999; U.S. application Ser. No. 09/474,473, entitled Occupant Detection System, filed on Dec. 29, 1999; U.S. application Ser. No. 09/474,673, entitled Occupant Sensor, filed on Dec. 29, 1999; and U.S. application Ser. No. 09/474,469, entitled Occupant Sensor, filed on Dec. 29, 1999.

The above-identified applications are incorporated herein by reference.

The instant invention generally relates to occupant detection systems and more particularly to occupant detection systems for influencing the deployment of a safety restraint system responsive to a crash and responsive to the occupant.

In the accompanying drawings:

FIG. 6 illustrates a flow chart of an embodiment of the instant invention;

FIG. 7 illustrates a sensing circuit in accordance with the instant invention;

FIG. 8 illustrates the operation of various elements of the sensing circuit of FIG. 8.

Figure 1:
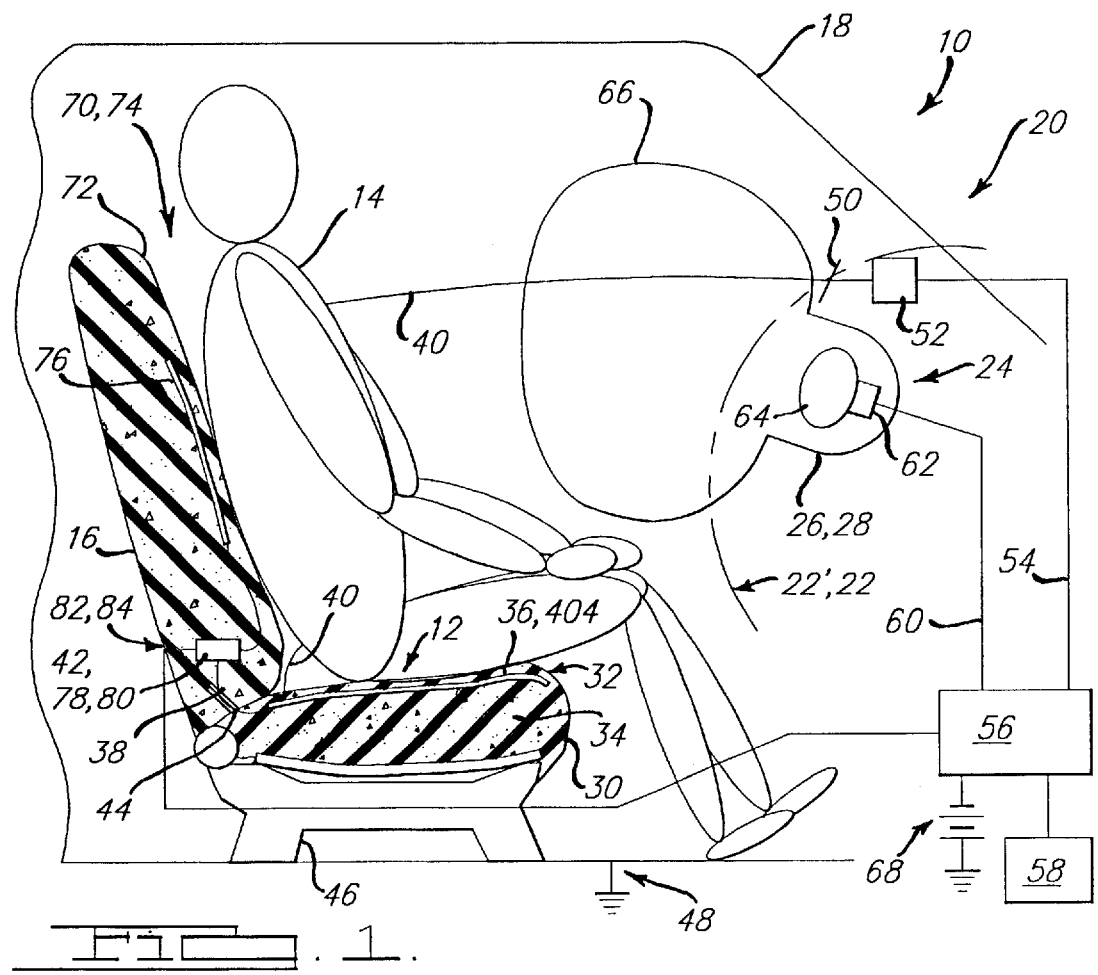
FIG. 1 illustrates an embodiment of the instant invention.

Referring to FIG. 1, an occupant detection system 10 comprises a first electric field sensor 12 for identifying whether there is normally seated, forward facing occupant 14 on the vehicle seat 16 of a vehicle 18, and a second electric field sensor 20 for determining if a part of the occupant 14, or another occupant 14', is within a region 22'—also known as an at-risk zone 22—proximate to a restraint actuator 24 of an associated safety restraint system 26. Occupants within the at-risk zone 22 of the associated safety restraint system 26 may be susceptible to injury by the restraint actuator 24 of a safety restraint system 26, which in FIG. 1 is illustrated comprising an air bag inflator 28.

An example of the first electric field sensor 12 is illustrated in FIG. 1 in the seat bottom 30 under the seat cover 32 and close to the top of the foam cushion 34. The first electric field sensor 12 comprises at least one first electrode 36 operatively coupled to at least one first applied signal 38 so as to generate an electric field 40 proximate to the at least one first electrode 36 responsive to the first applied signal 38. The first applied signal 38 for example comprises either an oscillating or pulsed signal. At least one first electrode 36 is operatively coupled to a first receiver 42 which outputs at least one first received signal 44 responsive to the electric field 40 at the corresponding first electrode 36, wherein the first received signal 44 is responsive to at least one electric-field-influencing property—for example dielectric constant, conductivity, size, mass or distance—of an object proximate to the first electric field sensor 12. For example, for the first electric field sensor 12 as a capacitance sensor, the first receiver 42 measures the capacitance of at least one first electrode 36 with respect to either another first electrode 36 or with respect to a surrounding ground, for example a seat frame 46 of the vehicle seat 16, connected to circuit ground 48.

The at least one first electrode 36 may shaped and located so as to be able to distinguish seating conditions for which the restraint actuator 24 should be deployed from seating conditions for which the restraint actuator 24 should not be deployed so as to avoid causing more injury to an occupant 14 than the occupant 14 would otherwise incur without the deployment of the restraint actuator 24. For example, the first electrode 36 is shaped and located so that a capacitance of the at least one first electrode 36 with respect to a circuit ground 48 is substantially greater for a seating conditions for which the restraint actuator 24 should be deployed, for example an occupant 14 seated in substantially normal seating position on the vehicle seat 16 or a large body immediately above the seat bottom 30; than for a seating condition for which the restraint actuator 24 should not be deployed, for example an empty vehicle seat 16, an infant, child, or booster seat on the vehicle seat 16 with or without an infant or child seated therein, or an occupant 14 on the vehicle seat 16 in a position that is substantially different from a normal seating position. The at least one first electrode 36 is, for example, substantially the same size as a region to be sensed on the vehicle seat 16, and sections of the at least one first electrode 36 may be removed to selectively reduce the sensitivity thereof proximate to regions where an infant or child, in an infant, child, or booster seat, is closest to the vehicle seat 16.

The second electric field sensor 20 comprises at least one second electrode 50 proximate to the restraint actuator 24 of a safety restraint system 26. The second electrode 50 is operatively coupled to a second receiver 52 which outputs at least one second received signal 54 responsive to the electric field 40 influencing the second electrode 50, as generated by the first electric field sensor 12, responsive to both the proximity of an object to the second electrode 50, and to the electrostatic coupling of the object to the first electric field sensor 12. The second receiver 52 monitors the oscillating or pulsed signal generated by the first electric field sensor 12. For example, when a pulse is sent out from the first electric field sensor 12 in the seat bottom 30, the occupant's body effectively becomes part of a "transmission antenna". These pulses become weaker as the separation between the occupant's body and the second electrode 50 increases, and this relationship can be used to determine if the body part in the at-risk zone 22 is part of the occupant 14 seated directly on the seat bottom 30 so as to be strongly coupled to the first applied signal 38 applied to first electric field sensor 12.

Figure 2A:
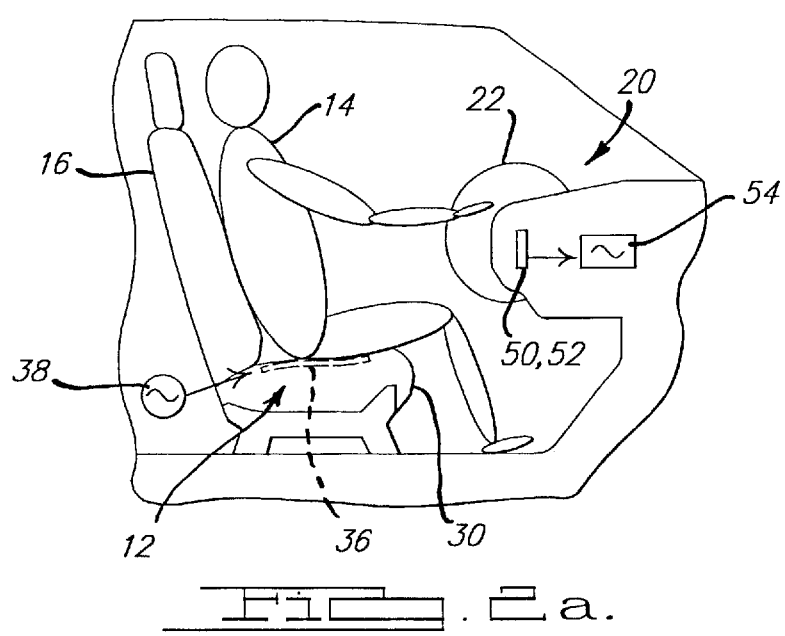
FIG. 2 illustrates the operation of first and second electric field sensors in accordance with the instant invention.
Figure 2B:
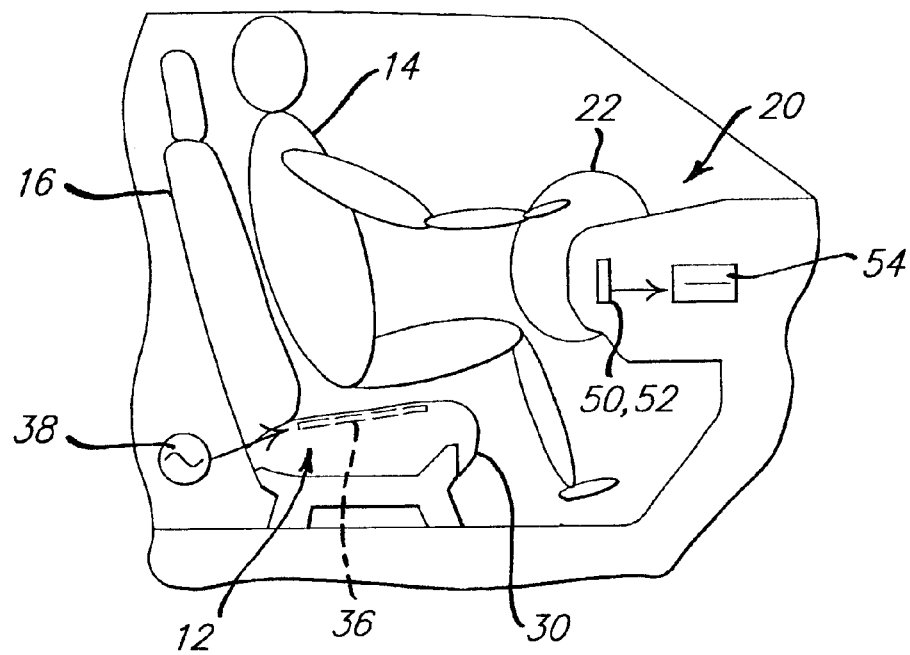

Referring to FIGS. 2a and 2b, the second electric field sensor 20 identifies if a body part detected in the at-risk zone 22 is well coupled to the first electric field sensor 12 in the seat bottom 30 using a "transmission through the occupant" phenomenon, whereby a variation in voltage applied to the first electric field sensor 12 in the seat bottom 30 is coupled through the occupant 14 seated on the vehicle seat 16. Currents in the occupant's body effectively make the occupant's body an extension of the at least one first electrode 36 of the first electric field sensor 12. If the occupant's hand is in the at-risk zone 22, the voltage variation at the first electric field sensor 12 can be sensed by the second receiver 52 of the second electric field sensor 20, illustrated in the instrument panel. Accordingly, as illustrated in FIG. 2a, the second received signal 54 is detected by the second receiver 52 when the occupant 14 is electrostatically well coupled to the seat bottom 30. Moreover, as illustrated in FIG. 2b, the second received signal 54 is not detected by the second receiver 52 when the occupant 14 is not electrostatically coupled to the seat bottom 30.

If there is a body part in the at-risk zone 22, the second receiver 52 of the second electric field sensor 20 senses a strong signal from the first electric field sensor 12, if there is strong "transmissive" coupling between the seat bottom 30 and the at least one second electrode 50 of the second electric field sensor 20. Typically, this occurs when the body part in the at-risk zone 22 is part of the occupant 14 seated directly on the vehicle seat 16, so that a strong second received signal 54 is indicative of the body part in the at-risk zone 22 belonging to an occupant 14 seated directly on the vehicle seat 16. Otherwise, if there is a body part in the at-risk zone 22, a second received signal 54 that is not strong is indicative of the body part in the at-risk zone 22 belonging to an occupant 14' not seated directly on the vehicle seat 16, for example as would result from a "child-on-lap" condition.

The situations of an adult on the vehicle seat 16 and either a child on the lap of the adult or a child standing between the air bag and the seated adult are generally designated as "child-on-lap" conditions, for which the restraint actuator 24, for example an air bag inflator 28, is disabled whenever a child is detected within the at-risk zone 22 the air bag inflator 28. Stated in another way, the second electric field sensor 20 uses a transmitted signal from the first electric field sensor 12 to identify whether the occupant 14 in the at-risk zone 22 is an occupant 14 on the vehicle seat 16. If the second received signal 54 of the second electric field sensor 20 by the second electrode 50 proximate to the air bag inflator 28 is not strong, then the occupant 14 detected by the second electric field sensor 20 in the at-risk zone 22 could be a "child-on-lap" condition, so the air bag inflator 28 is disabled.

Accordingly, the first electric field sensor 12 generates an electric field 40 with a first applied signal 38 applied to at least one first electrode 36, and senses the influence of an electric-field-influencing object the electric field 40 with a first receiver 42 operatively connected to at least one first electrode 36. The electric field 40 generated by the first electric field sensor 12 is sensed by the second electric field sensor 20 with a second receiver 52 operatively connected to at least one second electrode 50, at a location proximate to a restraint actuator 24 of a safety restraint system 26, whereby the strength of the second received signal 54 from the second electric field sensor 20 is dependent upon the proximity of an occupant 14 thereto, and to the degree of coupling by the occupant 14 from the first electric field sensor 12 to the second electric field sensor 20.

As used herein, the term "electric field sensor" refers to a sensor that generates a signal responsive to the influence of that being sensed upon an electric field. Generally, and electric field sensor comprises at least one electrode to which is applied at least one applied signal and at least one electrode—which could be the same electrode or electrodes to which the applied signal is applied—at which a received signal (or response) is measured. The applied signal generates an electric field from the at least one electrode to a ground in the environment of the at least one electrode, or to another at least one electrode. The applied and received signals can be associated with the same electrode or electrodes, or with different electrodes. The particular electric field associated with a given electrode or set of electrodes is dependent upon the nature and geometry of the electrode or set of electrodes and upon the nature of the surroundings thereto, for example the dielectric properties of the surroundings. For a fixed electrode geometry, the received signal or signals of an electric field sensor are responsive to the applied signal or signals and to the nature of the environment influencing the resulting electric field, for example to the presence and location of an object with a permittivity or conductivity different to that of its surroundings.

One form of electric field sensor is a capacitive sensor, wherein the capacitance of one or more electrodes is measured—from the relationship between received an applied signals—for a given electrode configuration. The technical paper "Field mice: Extracting hand geometry from electric field measurements" by J. R. Smith, published in IBM Systems Journal, Vol. 35, Nos. 3 & 4, 1996, pp. 587–608, incorporated herein by reference, describes the concept of electric field sensing as used for making non-contact three-dimensional position measurements, and more particularly for sensing the position of a human hand for purposes of providing three dimensional positional inputs to a computer. What has commonly been referred to as capacitive sensing actually comprises the distinct mechanisms of what the author refers to as "loading mode", "shunt mode", and "transmit mode" which correspond to various possible electric current pathways. In the shunt mode, a voltage oscillating at low frequency is applied to a transmit electrode, and the displacement current induced at a receive electrode is measured with a current amplifier, whereby the displacement current may be modified by the body being sensed. In the "loading mode", the object to be sensed modifies the capacitance of a transmit electrode relative to ground. In the transmit mode, the transmit electrode is put in contact with the user's body, which then becomes a transmitter relative to a receiver, either by direct electrical connection or via capacitive coupling.

Accordingly, the first electric field sensor 12 is either what is commonly known as a capacitive sensor, or more generally an electric field sensor operating in any of the above described modes, wherein the first electric field sensor 12 generates an electric field 40 from the first applied signal 38 applied to at least one first electrode 36 and senses objects proximate to the associated at least one first electrode 36, for example in the seat bottom 30 of a vehicle seat 16, from the influence of the electric field 40 on the first received signal 44. The at least one first electrode 36 of the first electric field sensor 12, the first applied signal 38 applied thereto, and the sensitivity of the first receiver 42 are all adapted so that the first electric field sensor 12 is substantially non-responsive to objects that are more than 50 mm above the seat bottom 30, but is responsive to occupants that are normally seated directly on the vehicle seat 16.

An electrode of the first 12 and second 20 electric field sensors may be constructed in a variety of ways, and the method of construction is not considered limiting. For example, an electrode may be constructed using rigid circuit board or a flexible circuit using known printed circuit board techniques such as etching or deposition of conductive materials applied to a dielectric substrate. Alternately, an electrode may comprise a discrete conductor, such as a conductive film, sheet or mesh that is distinct from or an integral part of the vehicle seat 16 or components thereof. The assembly of one or more electrodes together with the associated substrate is referred to herein as a sensing pad.

Figure 3:
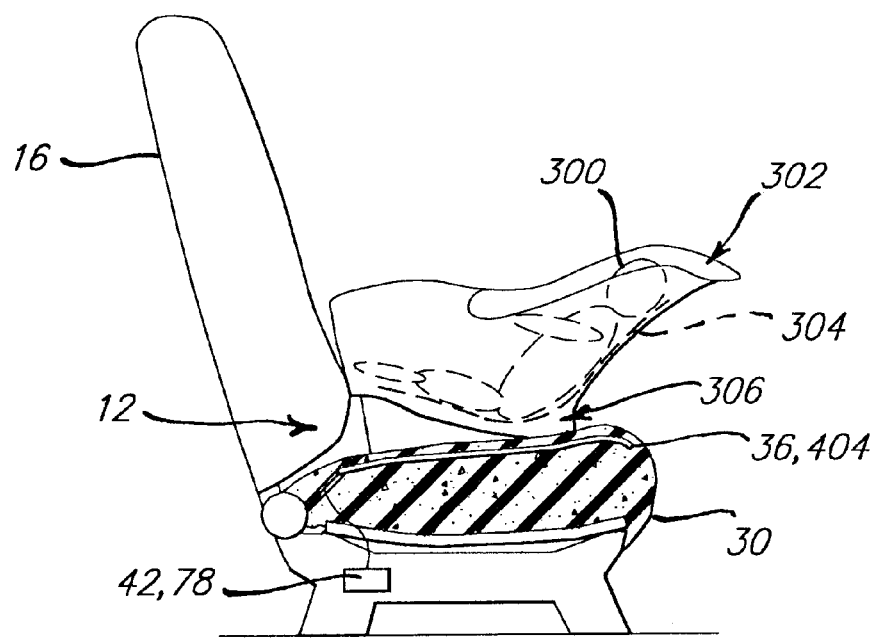
FIG. 3 illustrates a child in a typical rear facing infant seat placed on a vehicle seat incorporating an electric field sensor in accordance with the instant invention.

The occupant detection system 10 can be used to sense infants or children in rear facing infant seats, child seats or booster seats, on the basis that the child 300 therein does not have a large surface of its body very near to the seat bottom 30 and the at least one first electrode 36 contained therein. For example, referring to FIG. 3 illustrating a child 300 in a typical rear facing infant seat 302, the seating contour 304 inside the rear facing infant seat 302 is such that the buttocks of the child 300 are closest to the seat bottom 30 of the vehicle seat 16. Usually there is a significant gap 306, up to several inches, between the child 300 and the seat bottom 30 of the vehicle seat 16. Since rear facing infant seats 302 are generally made of plastic, the seats themselves are not sensed directly by the first electric field sensor 12. Even for a rear facing infant seat 302 for which the gap 306 between the child 300 and the seat bottom 30 of the vehicle seat 16 is relatively small, the inside seating contour 304 still creates a significant gap between the at least one first electrode 36 and all parts of the child 300 except the buttocks. Since only a small portion of the surface of the child 300 is near to the at least one first electrode 36, the associated capacitance thereof is relatively low, and more particularly, less than a threshold capacitance, $C_{norm}$ for detecting a normally seated occupant 14.

Figure 4:
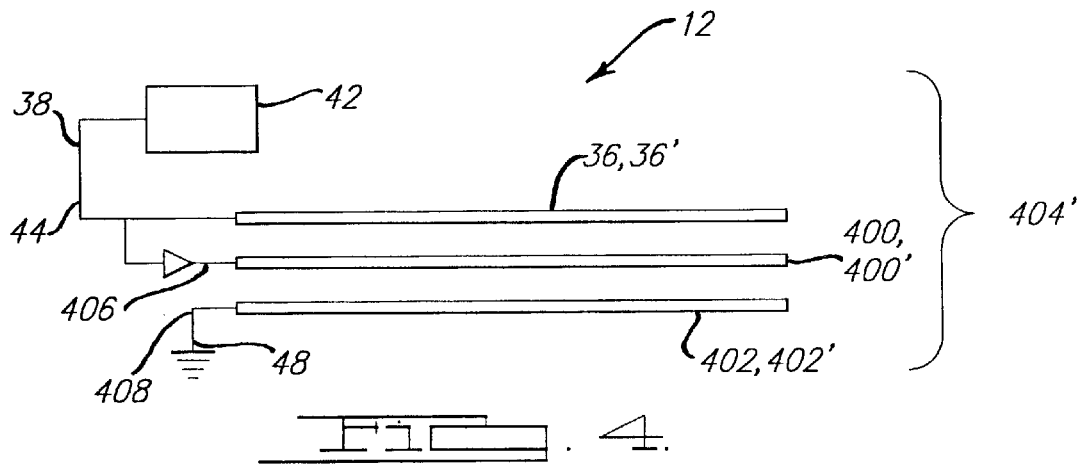
FIG. 4 illustrates a cross section of one embodiment of an electric field sensor in accordance with the instant invention.

The first electric field sensor 12 may be adapted to reduce the effect that liquids proximate to a first electrode 36 can have on the capacitance thereof with respect to a circuit ground 48, or with respect to another first electrode 36. For example, liquids spilled on and absorbed by the foam cushion 34 can increase the capacitance of the first electrode 36 with respect to the circuit ground 48. Referring to FIG. 4, the first electric field sensor 12 can be adapted to reduce the effect of a wetting of the foam cushion 34 by incorporating a third electrode 400, known as a driven shield 400', and/or a fourth electrode 402, known as a ground plane 402', under the at least one first electrode 36, known as a sensing electrode 36', wherein the first 36, third 400 and fourth 402 electrodes are insulated from one another, for example by at least one dielectric substrate. For example, the first 36, third 400 and fourth 402 electrodes may be integrated so as to form a single capacitive sensing pad 404'. The driven shield 400' is a second conductor under the conductor of the sensing electrode 36' that is driven at the same potential as the sensing electrode 36', resulting in a cancellation of the electric field between the sensing electrode 36' and the driven shield 400'. The driven shield 400' eliminates the sensing capability of the capacitive sensing pad 404' on the side of the sensing electrode 36' where the driven shield 400' is located. The capacitive sensing pad 404' is further improved with a ground plane 402' under the driven shield 400' so that the circuit driving the driven shield 400' drives a consistent load.

Accordingly, as so adapted, the first electric field sensor 12 further comprises at least one third electrode 400 and at least one fourth electrode 402, wherein the at least one third electrode 400 is located between the at least one first electrode 36 and the at least one fourth electrode 402, and the at least one third electrode 400 is operatively coupled to a second applied signal 406. For example, the at least one third electrode 400 is substantially the same size as the at least one first electrode 36; the second applied signal 406 is substantially the same as the first applied signal 38; the at least one fourth electrode 402 is located between the at least one first electrode 36 and a foam cushion 34 of the vehicle seat 16; the at least one fourth electrode 402 is substantially the same size as the at least one first electrode 36; and the at least one fourth electrode 402 is operatively connected to a circuit ground 48, or to a third applied signal 408, wherein the third applied signal 408 is a circuit ground 48 potential.

The driven shield 400' and/or ground plane 402' are for example near to or slightly larger than the sensing electrode 36', and are provided to minimize the effects of liquid in the foam cushion 34 below the driven shield 400' and/or ground plane 402' on the capacitance of the sensing electrode 36', rather than to extend the range and sensitivity of the electric field sensor. The driven shield 400' and the sensing electrode 36' essentially covers the entire area to be sensed on the vehicle seat 16. Alternately, a plurality of first electrodes 36 are distributed sparsely across the vehicle seat 16, thereby covering a smaller area than the entire area to be sensed on the vehicle seat 16. Each first electrode 36 can be embodied in a variety of sizes and shapes, and for a plurality of first electrodes 36, the arrangement thereof can be embodied in a variety of patterns.

In one embodiment, the at least one first electrode 36 comprises a plurality of first electrodes 36 operatively coupled to the first receiver 42 so that different signals from different first electrodes 36 provide information associated with the distribution of an object on the vehicle seat 16, for example the seating location of an occupant 14 or the size of an occupant 14.

The first 12 and second 20 electric field sensors are operatively connected to a controller 56, which is operatively coupled to the restraint actuator 24 of a safety restraint system 26. The controller 56 discriminates the type and location of an object or occupant 14 located on the vehicle seat 16, or generally between the vehicle seat 16 and the safety restraint system 26, and controls the actuation of a safety restraint system 26 responsive thereto in the event of a crash. The controller 56 distinguishes, from the second received signal 54—for example from the magnitude thereof—a body part of an occupant 14 seated on the vehicle seat 16 from a body part of an occupant 14 not seated directly on the vehicle 18, and controls the actuation of a safety restraint system 26 responsive thereto. For example, the controller 56 disables the safety restraint system 26 if a body part is detected from an occupant 14 not seated directly on the vehicle seat 16. For example if the magnitude of the second received signal 54, representing a current transmitted from the first electric field sensor 12 to at least one second electrode 50 or a capacitance of at least one second electrode 50, is less than a first threshold, then the safety restraint system 26 is disabled. The first threshold corresponds to the worst case "child-on-lap" condition, or stated another way, the highest capacitance or transmitted current that can be expected from a child proximate to the restraint system. Furthermore, for example, the controller 56 enables the safety restraint system 26 if the first electric field sensor 12 senses an occupant 14 seated on the vehicle seat 16 and the magnitude of the second received signal 54 is greater than a second threshold, indicating that the body part within the at-risk zone 22 belongs to an occupant 14 seated on the vehicle seat 16. However, if the second received signal 54 remains greater than a second threshold for a period of time greater than a third threshold, for example as a result of an occupant 14 in the seat with their feet or legs placed proximate to the safety restraint system 26, then the safety restraint system 26 is disabled.

In operation, an occupant 14 seated on the seat bottom 30 of a vehicle seat 16 sufficiently increases the capacitance of the first electric field sensor 12 so as to indicate to the controller 56 from the first receiver 42 that an occupant 14 is seated against the vehicle seat 16. The second electric field sensor 20 determines if a portion of the occupant 14 is located within the at-risk zone 22 of the air bag inflator 28. The signals from the first 12 and second 20 electric field sensors are operatively coupled to a controller 56 which operates in accordance with known analog, digital, or microprocessor circuitry and software. A crash sensor 58 is also operatively coupled to the controller 56. Responsive to a crash detected by the crash sensor 58, if an occupant 14 is seated on the seat 3 and is not located within the at-risk zone 22 of the air bag inflator 28, the controller 56 generates a signal 60 which is operatively coupled to one or more initiators 62 of one or more gas generators 64 mounted in an air bag inflator 28, thereby controlling the actuation of the air bag inflator 28 so as to inflate the air bag 66 as necessary to protect the occupant 14 from injury which might otherwise be caused by the crash. The electrical power necessary to carry out these operations is provided by a source of power 68, for example the vehicle battery.

Referring to FIG. 1, in accordance with another, alternate but not essential, embodiment further comprises a range/proximity sensor 70 mountable within the seat back 72 of a vehicle seat 16, wherein the range/proximity sensor 70 when mounted in the seat back 72 of the vehicle seat 16 is for example responsive to a torso of an occupant 14 proximate to the seat back 72, and provides a measure of distance from the seat back 72 to the torso of the occupant 14. The range/proximity sensor 70 operates in accordance with any sensing technology that can provide a measure of the proximity or distance of an occupant 14 to the seat back 72, for example, including but not limited to a third electric field sensor 74 comprising at least one fifth electrode 76, a capacitive sensor, a radar sensor, an optical range sensor, an active infrared sensor, a passive infrared sensor, a vision sensor, an ultrasonic range sensor, and an inductive sensor. The range/proximity sensor 70 is operatively connected to the controller 56, which discriminates the type of object on the vehicle seat 16 from the at least one first received signal 44, alone or in combination with the at least one second received signal 54, and controls the actuation of a safety restraint system 26 responsive thereto, whereby if the second electric field sensor 20 detects an object within an at-risk zone 22 proximate to the safety restraint system 26 then the controller 56 controls the actuation of a safety restraint system 26 responsive to the range/proximity sensor 70. The range/proximity sensor 70, for example a a third electric field sensor 74 comprising at least one fifth electrode 76, is adapted to be responsive to objects within about 50 mm of the seat back 72 within a region from about 250 mm to 500 mm from the seat bottom 30 of the vehicle seat 16.

For an occupant detection system 10 comprising a third electric field sensor 74 as a range/proximity sensor 70 in the seat back 72, both the first 12 and third electric field sensor 74 can share a common electronics module 78 that contains respective first 42 and third 80 receivers that are operatively connected to the respective at least one first electrode 36 and at least one fifth electrode 76. Alternately, the first 42 and third 80 receivers can be located proximate to the associated first and fifth 76 electrodes. The first applied signal 38 of the first electric field sensor 12 is generated by an associated first signal generator 82, and can also be operatively coupled to at least one fifth electrode 76 of the third electric field sensor 74. In one alternative, a second applied signal 406 from a second signal generator 84 can be operatively connected to at least one fifth electrode 76 of the third electric field sensor 74. In another alternative, the third electric field sensor 74 can be operated in the "transmit mode" relative to the first electric field sensor 12, as is the second electric field sensor 20, wherein the first electric field sensor 12 from at least one first electrode 36 of the first electric field sensor 12 is detected by the third receiver from the at least one fifth electrode 76 of the third electric field sensor 74. As with the first 42 and third 80 receivers, the first signal generator 82 or the first 82 and second 84 signal generators can also be located in the common electronics module 78, or located proximate to the associated first 36 and fifth 76 electrodes.

The range/proximity sensor 70 in the seat back 72 of the vehicle seat 16 enables the controller 56 to respond to the movement of the occupant 14 after the crash has begun. In frontal crashes of sufficient severity that the occupant 14 starts moving forward relatively quickly after the initial impact, the range/proximity sensor 70 in the seat back 72 can determine if the occupant 14 has moved away from the seat back 72 soon after the crash begins, so as to possibly disable the air bag inflator 28 if the occupant's limbs are in the at-risk zone 22. However, even in relatively severe crashes, it takes approximately 50 milliseconds for the occupant 14 to move 20 centimeters. Furthermore, there is usually a gap of at least 20 centimeters between the at-risk zone 22 and the occupant's head or torso when the occupant 14 is seated against the seat back 72. Accordingly, whenever an occupant 14 is sensed near to the seat back 72, it is relatively unlikely for that occupant's head or torso to be within the at-risk zone 22 for at least 50 milliseconds, so that the air bag inflator 28 can safely remain enabled until 50 milliseconds after the occupant 14 moves forward of the seat back 72. Because air bag inflators typically deploy in nearly all crashes within that 50 milliseconds, it is relatively unlikely that there would be an inadvertent non-deployment when a limb is in the at-risk zone 22 and the occupant 14 moves forward of the seat back 72 responsive to the crash.

Figure 5:
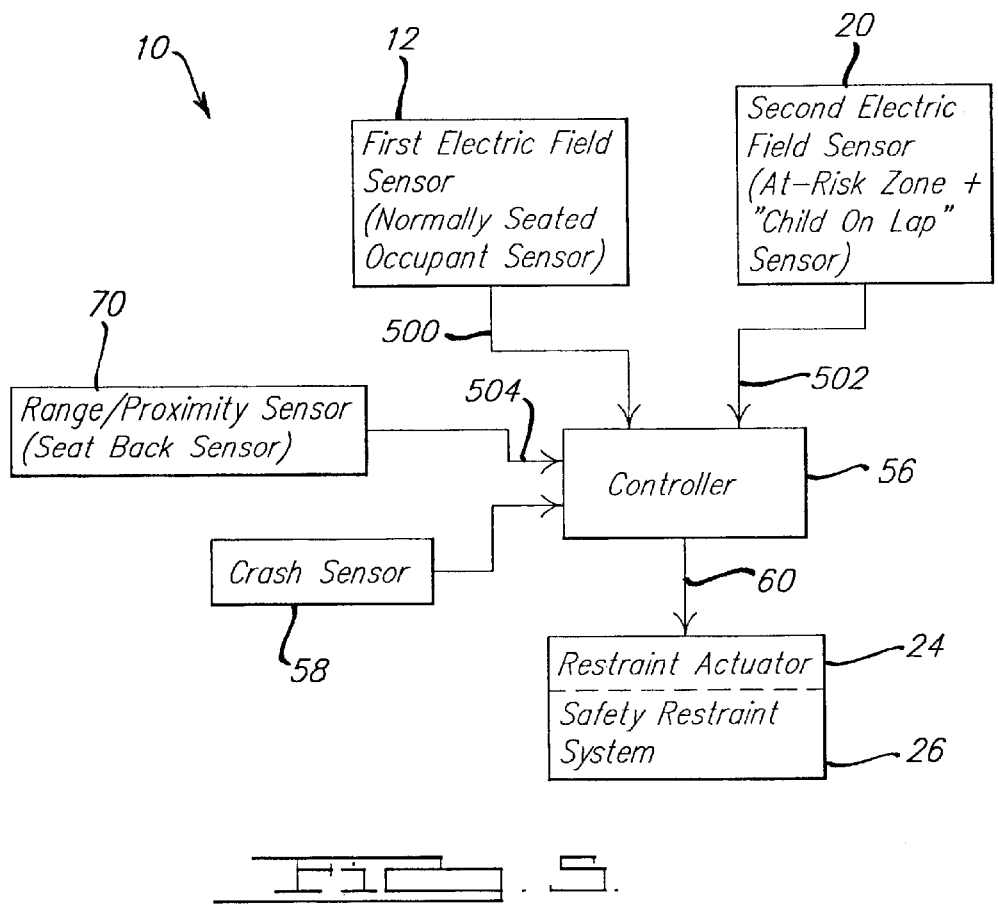
FIG. 5 illustrates a block diagram of an embodiment of the instant invention.

Referring to FIG. 5, a first electric field sensor 12 senses if an occupant 14 is seated on the vehicle seat 16 and outputs a first signal 500 representative thereof to the controller 56, wherein the associated identification process can be performed either by the first electric field sensor 12 or by the controller 56. A second electric field sensor 20 senses whether an object is located within the at-risk zone 22 of the safety restraint system 26, senses the degree to which that object is electrostatically coupled to the vehicle seat 16, so as to for example distinguish a part of a normally seated occupant 14 from a "child-on-lap" condition, and outputs a second signal 502 representative thereof to a controller 56, wherein the associated identification process can be performed either by the second electric field sensor 20 or by the controller 56. The range/proximity sensor 70 in the seat back 72 senses the distance of the occupant 14 from seat back 72 and outputs a third signal 504 representative thereof to the controller 56, wherein the associated identification process can be performed either by the range/proximity sensor 70 or by the controller 56. The controller 56 determines from respective first 500, second 502, and third 504 signals whether or not to disable the safety restraint system 26, or whether or not to activate the safety restraint system 26 responsive to a crash sensed by a crash sensor 58, wherein the crash sensor 58 may be either distinct from or incorporated in the controller 56.

The operation of an embodiment is further illustrated with reference to the flow diagram of an algorithm illustrated in FIG. 6. At the beginning, in step (602), a presence flag is reset, wherein the presence flag indicates the presence of an occupant 14 on the seat. Then in step (604), a measurement is made by the first electric field sensor 12 so as to detect the presence of an occupant 14 on the seat. If in step (606) an occupant 14 is detected as being seated directly on the seat, for example as would be the case for a normally seated occupant 14, then in step (608) if the presence flag is not set, then in step (610) the presence flag is set and in step (612) the first time of a continuous interval of presence is saved as $t_0$. Otherwise, in step (614) the presence flag is reset, indicating that an occupant 14 is not present on the seat, and if in step (616) there has not been an occupant 14 seated directly on the seat for a predetermined period of time i.e. THRESHOLD1 (for example, 3 seconds) then the restraint actuator 24 is disabled in step (618); otherwise the process is repeated beginning with step (604). If in step (620), there has been an occupant 14 seated directly for a predetermined period of time i.e. THRESHOLD2 (for example, 3 seconds) then in step (622) the distance $D_B(t)$ of the occupant 14, for example the distance of the torso of the occupant 14 from the seat back 72, is measured by the range/proximity sensor 70; and in step (624) a measurement of the second electric field sensor 20 is made to detect whether a body part is located within the at-risk zone 22 of the restraint actuator 24. If in step (626) a body part is not located within the at-risk zone 22 of the restraint actuator 24, then the restraint actuator 24 is enabled in step (628). Otherwise, if in step (630) the second received signal 54 (M2) is less than a threshold, i.e. THRESHOLD3, for example because of a "child-on-lap" condition of a child either seated on the lap of an adult, or standing proximate to the restraint actuator 24—then the restraint actuator 24 is disabled in step (618). Otherwise, from step (630), if in step (632) there has been an occupant 14 near to the seat back 72 within a time period that is consistent with the ability of the occupant's head/torso to move to the at-risk zone 22 (for example within approximately 50 milliseconds), or more particularly, if the distance $D_B$ from the range/proximity sensor 70, at a previous time, i.e. THRESHOLD4, is less than a distance threshold, i.e. THRESHOLD5, then if in steps (634) and (636) the second received signal 54 (M2) is greater than a threshold, i.e. THRESHOLD6, for a maximum continuous period of time less than a time period threshold, i.e. THRESHOLD7, for example indicating that an occupant 14 is not resting their feet or legs against or proximate to the restraint actuator 24, then the restraint actuator 24 is enabled in step (628). Otherwise, from steps (634) or (636) in step (618) the restraint actuator 24 is disabled. Moreover, otherwise from step (632), for example if there has not been an occupant 14 near to the seat back 72 within a time period that is consistent with the ability of the occupant's head/torso to move to the at-risk zone 22 (for example within approximately 50 milliseconds), or more particularly, if the distance $D_B$ from the range/proximity sensor 70, at a previous time, i.e. THRESHOLD4, is not less than the distance threshold, i.e. THRESHOLD5; then in step (618) the restraint actuator 24 is disabled. For example, a 30 mph rigid barrier impact in a fairly stiff platform, for which the time-to-fire for an air bag inflator 28 would be about 15 milliseconds, the unbelted adult occupant 14 moves approximately 20 centimeters in 50 milliseconds. Following either steps (628) or (618) the process is repeated beginning with step (604).

The crash sensor 58 in step (650) detects the occurrence of a crash, and if in step (652) a crash is detected, of sufficient magnitude to possibly require activation of the safety restraint system 26, then, in step (654), if the restraint actuator 24 has been enabled in step (628), the restraint actuator is actuated in step (656), wherein the actuation of the restraint actuator 24 may be controlled responsive to the measurements in steps (604), (622) or (624).

The capacitance of the at least one first electrode 36 relative to circuit ground 48 is relatively small, for example less than about 300 picofarads. The temperature range that is possible in an automotive environment can significantly affect the components of the associated sensing circuit 700—an example of which is illustrated in FIG. 7—causing drift that can be erroneously interpreted as a measurement that could enable the safety restraint system 26 to be erroneously enabled by the controller 56. The effects of this drift can be mitigated by incorporating a temperature stable reference capacitor in the sensing circuit 700 that is switched in place of the sensing circuit 700 so as to provide a means for making comparative capacitive measurements. Since the reference capacitor can be selected such that its value is stable over a range of temperatures, drifts thereof can be identified and quantified, and this information can be used to alter a decision threshold, for example responsive to a drift in circuit elements of the sensing circuit 700 with respect to temperature or time.

Referring to FIG. 7, illustrating an exemplary sensing circuit 700, an oscillator 702 generates an oscillating signal, for example a sinusoidal signal, that is filtered by a first bandpass filter 704 so as to create a first oscillating signal 706. The first oscillating signal 706 is applied to a capacitive voltage divider 708 comprising capacitor C1, resistors R1 and R2, and one or more capacitive elements to be measured, selected from the group consisting of a capacitive sensing pad 404, comprising at least one first electrode 36, a first reference capacitor CR1, and a second reference capacitor CR2, wherein the capacitive elements to be measured are included or excluded responsive to the states of respective FET switches Q1a, Q1b, Q2a, Q2b, Q3a, and Q3b. Capacitor C1, resistors R1 and R2, and the FET switches Q1a, Q2a, and Q3a—that when active switch in the respective capacitive elements to be measured,—are all connected to one another at a first node 710, which is connected to the input 712 of a voltage follower U1. The output 714 of the voltage follower U1 is connected to FET switches Q1b, Q2b, and Q3b that when active, switch out the respective capacitive elements so as to not be measured. The activation of the FET switch elements of FET switch pairs Q1a and Q1b, Q2a and Q2b, and Q3a and Q3b are respectively mutually exclusive. For example if FET switch Q1a is activated or closed, then FET switch Q1b is deactivated or open. A capacitive element being measured adds to the capacitance at the first node, thereby affecting the strength of the signal at the input 712 to the voltage follower U1. A capacitive element not being measured is disconnected from the first node by its respective first FET switch element, and connected to the output 714 of the voltage follower U1 by its respective second FET switch element, wherein, in accordance with the characteristics of the associated operational amplifier of the voltage follower U1, the output 714 of the voltage follower U1 follows the signal of the first node without that respective capacitive element connected, and voltage follower U1 provides a current through the associated capacitive element through the second respective FET switch element. Moreover, when the respective second FET switch element is activated, the source and drain of the respective first FET switch element are separately coupled to the respective operational amplifier inputs, so that to each is applied the same potential, thereby eliminating the effect of the capacitance of the respective first FET switch on the capacitance measurement.

The output 714 of the voltage follower U1 is then coupled to a second bandpass filter 716 of the same pass band as the first bandpass filter 704, the output of which is detected by a detector 718 comprising diode D1, resistor R3 and capacitor C2, and filtered by a first low pass filter 720. The output 722 of the first low pass filter 720 has a DC component corresponding to the capacitance at the first node 710. This DC component is optionally filtered by an optional blocking capacitor C3, and the resulting signal is filtered by a second low pass filter 724 to provide the amplitude 726 of the oscillating signal at the first node 710, which is related to the total capacitance at that location. The blocking capacitor C3 is adapted so as to provide for a transitory measurement of the amplitude 726.

In operation, a microprocessor U2 controls the activation of FET switches Q1a, Q1b, Q2a, Q2b, Q3a, and Q3b, for example in accordance with the control logic illustrated in FIG. 8. With the first reference capacitor CR1 switched in by microprocessor U2, i.e. with Q2a activated and Q2b deactivated, the controller 56 measures a first amplitude. Then with the second reference capacitor CR2 also switched in by microprocessor U2, the controller 56 measures a second amplitude corresponding to an incremental increase of capacitance at the first node by the capacitance of capacitor CR2. Then the controller 56 computes a sensitivity factor in Volts/picofarad given the known values of capacitance of capacitors CR1 and CR2. Then, the microprocessor U2 switches out the first CR1 and second reference capacitor CR2, switches in the capacitive sensing pad 404, measures a third amplitude, and calculates the capacitance of the capacitive sensing pad 404 using the calculated sensitivity factor. The controller 56 compares this capacitance with a threshold so as to discriminate a normally seated occupant 14 from other seat occupancy conditions. If a normally seated occupant 14 is present, and if the second electric field sensor 20 does not disable the safety restraint system 26, the restraint actuator 24 is actuated responsive to the detection of a crash by the crash sensor 58. Whereas FIG. 7 illustrates the microprocessor U2 and controller 56 as separate elements that communicate with one another, alternate arrangements are possible. For example, both may be combined in one controller 56, or the microprocessor may be adapted to sense the amplitude measurements, calculate the capacitance of the capacitive sensing pad 404, and then output only this capacitance value to the controller 56.

The capacitive sensing pad 404 comprising the at least one first electrode 36, mounted in the vehicle seat 16, is modeled as a first capacitance CS1 in parallel with a series combination of a second capacitance CS2 and a resistance RS, wherein the resistance RS is inversely related to the wetness of the seat. The capacitance of the capacitive sensor is dominated by CS1 for a dry seat, but becomes affected by CS2 and RS as the wetness of the seat increases. The values of capacitance for capacitors C1, CR1, and CR2 are adapted to maximize the dynamic range of the capacitance measurement over the range of expected capacitances of the capacitive sensing pad 404.

The capacitance of the capacitive sensing pad 404 can be also measured by other means of measuring capacitance, as for example given in the *Standard Handbook for Electrical Engineers* 12$^{th}$ edition, D. G. Fink and H. W. Beaty editors, McGraw Hill, 1987, pp. 3-57 through 3-65 or in Reference Data for Engineers: Radio, Electronics, Computer, and Communications 7$^{th}$ edition, E. C. Jordon editor in chief, Howard W. Sams, 1985, pp. 12-3 through 12-12, both included herein by reference.

Figure 9A:
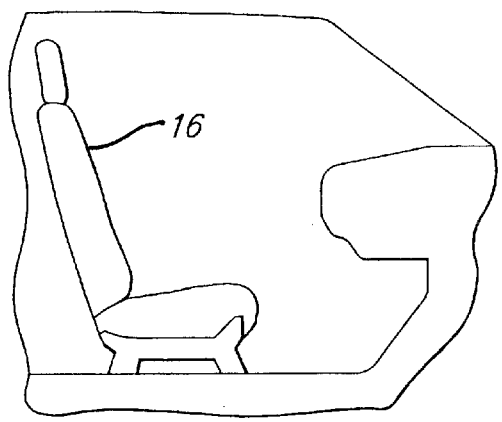
FIGS. 9a–j illustrates examples of various seat occupancy scenarios.
Figure 9B:
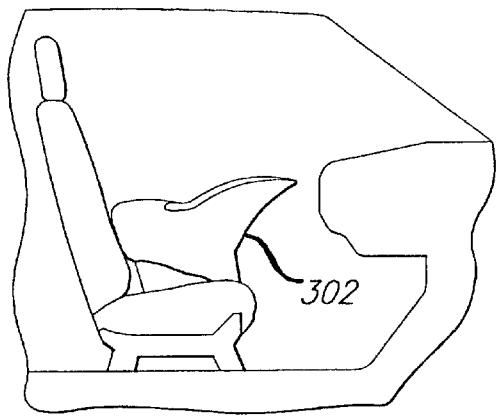
Figure 9C:
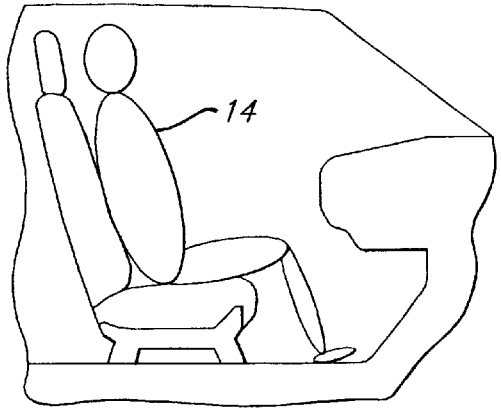
Figure 9D:
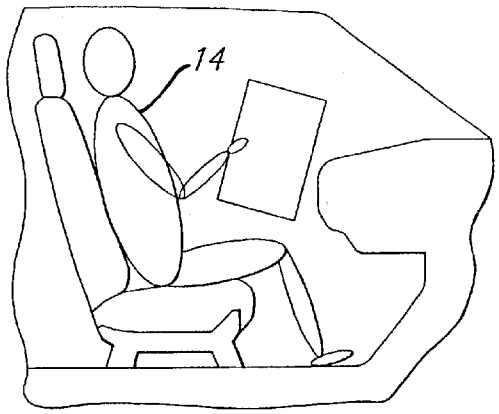
Figure 9E:
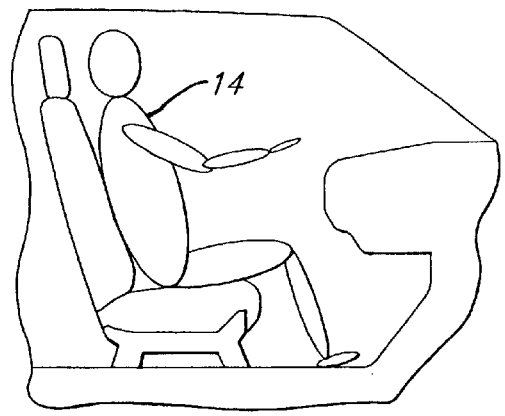
Figure 9F:
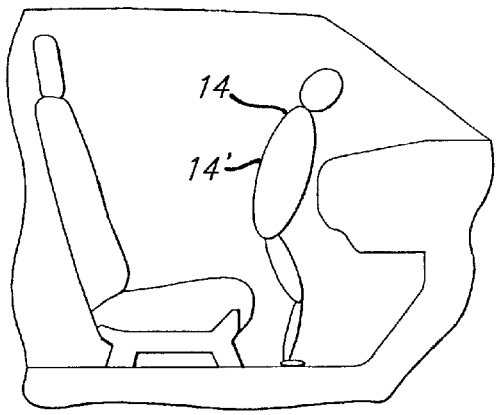
Figure 9G:
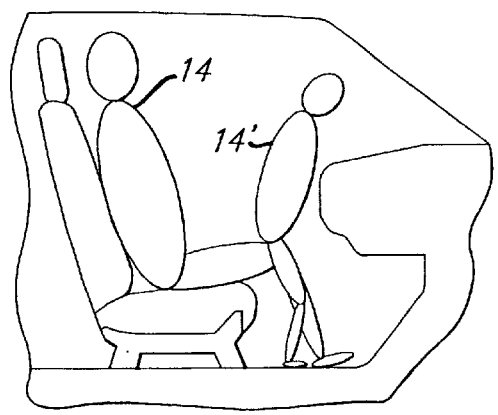
Figure 9H:
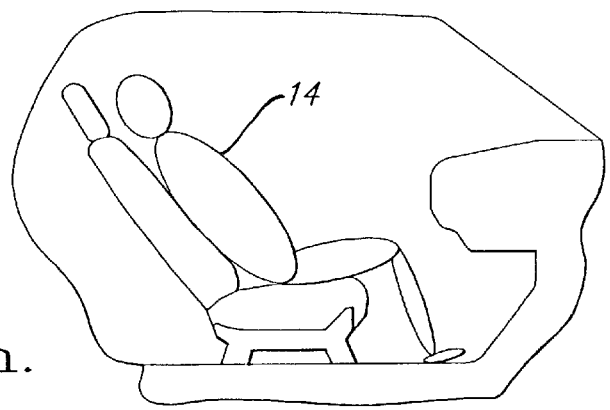
Figure 9I:
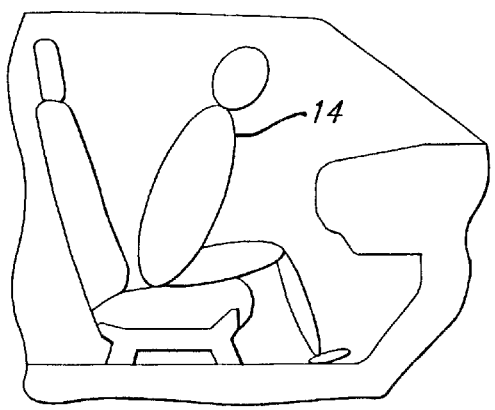
Figure 9J:
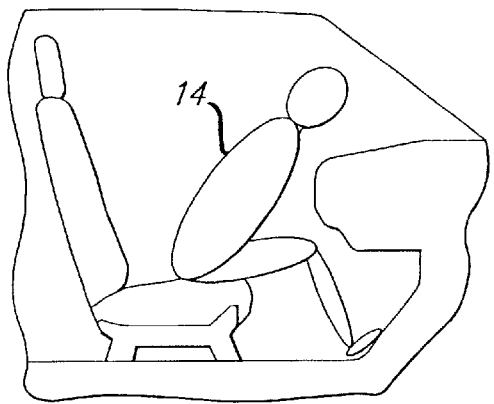

Referring to FIGS. 9a–j, the occupant detection system 10 of the instant invention provides the appropriate enable decision for nearly all typical situations. For example, in FIG. 9a illustrating an empty seat and in FIG. 9b illustrating a rear facing infant seat on the vehicle seat 16, the first electric field sensor 12 would disable the restraint actuator 24. In FIG. 9c, illustrating a normally seated adult, and in FIG. 9h, illustrating an adult seated in a reclined position, the restraint actuator 24 would be enabled because the first electric field sensor 12 would detect an occupant 14 seated on the seat bottom 30 and the second electric field sensor 20 would not detect the presence of an object within the at-risk zone 22. In FIG. 9d, illustrating a normally seated adult reading a newspaper, the restraint actuator 24 would be enabled because the first electric field sensor 12 would detect an occupant 14 seated on the seat bottom 30 and the second electric field sensor 20—for example a capacitive, electric field, or radar sensor—would not detect the presence of an object of sufficient density within the at-risk zone 22. However, if the second electric field sensor 20 were an active infrared or ultrasonic ranging sensor, the restraint actuator 24 could become disabled by this sensor in this situation, depending upon the sensor's ability to discriminate such objects. In FIG. 9e, illustrating a normally seated adult with a hand in the at-risk zone 22, the restraint actuator 24 would be enabled if the second electric field sensor 20 were preferably calibrated so as to not be responsive to an object the size of a human hand. In FIG. 9f, illustrating a small occupant 14 standing proximate to the restraint actuator 24, the restraint actuator 24 would be disabled by both the first electric field sensor 12, sensing an empty seat, and by the second electric field sensor 20, sensing an object in the at-risk zone 22. In FIG. 9g, illustrating a normally seated adult and a standing child; and in FIG. 9j, illustrating an adult leaning and seated forward, the restraint actuator 24 would be disabled by the second electric field sensor 20. Finally, in FIG. 9i, illustrated a seated adult leaning forward, the restraint actuator 24 would be enabled by the first electric field sensor 12, but possibly with reduced power if the second electric field sensor 20 is adapted to quantify distances outside the at-risk zone 22.

If it is mandatory that the air bag be suppressed for a small occupant 14, the at-risk zone sensing can prevent injuries when there is an out-of-position child between the air bag and an adult occupant 14 ("child-on-lap" condition) or when an adult is out-of-position. If it is acceptable to deploy the air bag when children are seated far from air bag module, then the electric field sensor in the seat bottom 30 could be used along with the at-risk zone sensor to form a complete dynamic suppression system.

While specific embodiments have been described in detail in the foregoing detailed description and illustrated in the accompanying drawings, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

We claim:
1. A system for detecting an occupant in a vehicle, comprising:
   a. a first electric field sensor comprising at least one first electrode mountable in a seat bottom of a vehicle seat, wherein said at least one first electrode is operatively coupled to at least one first applied signal so as to generate an electric field responsive to said at least one first applied signal, at least one said first electrode is operatively coupled to a first receiver, said first receiver outputs at least one first received signal responsive to said electric field at said at least one first electrode operatively coupled to said first receiver, and said at least one first received signal is responsive to at least one electric-field-influencing property of a first object proximate to said first electric field sensor; and b. a second electric field sensor comprising at least one second electrode proximate to a safety restraint system, wherein said at least one second electrode is operatively coupled to a second receiver, said second receiver outputs at least one second received signal, said at least one second received signal is responsive to the electric field influencing at least one of said at least one second electrode whereby said electric field is generated by said first electric field sensor, said at least one second received signal is responsive to a proximity of either said first object or a second object to said at least one second electrode, and said at least one second received signal is responsive to an electrostatic coupling of either said first object or said second object to said first electric field sensor.

2. A system for detecting an occupant in a vehicle as recited in claim 1, wherein said at least one first electrode is shaped so that a capacitance of said at least one first electrode with respect to a circuit ground is substantially greater for a seating condition selected from an occupant seated in substantially normal seating position on the vehicle seat and a large body immediately above said seat bottom; than for a seating condition selected from an empty said vehicle seat, an infant seat on said vehicle seat, a child seat on said vehicle seat, a booster seat on said vehicle seat, an infant seated in an infant seat on said vehicle seat, a child seated in a child seat on said vehicle seat, a child seated in a booster seat on said vehicle seat, and an occupant on said vehicle seat in a position that is substantially different from a normal seating position.

3. A system for detecting an occupant in a vehicle as recited in claim 1, wherein said at least one first electrode is substantially the same size as a region to be sensed on said vehicle seat.

4. A system for detecting an occupant in a vehicle as recited in claim 1, wherein said at least one first electrode is mounted under a seat cover of said vehicle seat.

5. A system for detecting an occupant in a vehicle as recited in claim 1, wherein said at least one first electrode is mounted above a foam cushion in said vehicle seat.

6. A system for detecting an occupant in a vehicle as recited in claim 1, wherein said at least one first electrode is mounted proximate to the location of an object selected from an infant seat on said vehicle seat, a child seat on said vehicle seat, a booster seat on said vehicle seat, and an occupant seated on said vehicle seat.

7. A system for detecting an occupant in a vehicle as recited in claim 1, wherein said vehicle seat comprises a seat frame, and said seat frame is connected to said circuit ground.

8. A system for detecting an occupant in a vehicle as recited in claim 1, wherein said first applied signal is selected from at least one oscillating signal and at least one pulsed signal.

9. A system for detecting an occupant in a vehicle as recited in claim 1, wherein said at least one first electrode comprises a plurality of first electrodes, said plurality of first electrodes are operatively coupled to said first receiver, and said at least one first received signal is responsive to the distribution of an object on said vehicle seat.

10. A system for detecting an occupant in a vehicle as recited in claim 9, wherein said at least one first received signal comprises a plurality of first received signals from different first electrodes.

11. A system for detecting an occupant in a vehicle as recited in claim 1, wherein said at least one electric-field-influencing property comprises a dielectric characteristic.

12. A system for detecting an occupant in a vehicle as recited in claim 1, wherein said at least one first received signal is responsive to a capacitance of at least one of said at least one first electrode with respect to at least another said first electrode.

13. A system for detecting an occupant in a vehicle as recited in claim 1, wherein said at least one first received signal is responsive to a capacitance of at least one of said at least one first electrode with respect to a circuit ground.

14. A system for detecting an occupant in a vehicle as recited in claim 1, wherein said first receiver further comprises:

a. a reference capacitor wherein a capacitance of said reference capacitor is stable over a range of temperatures; and b. a switch for switching said reference capacitor in place of at least one of said at least one first electrode operatively coupled to said first receiver, wherein a measurement of said reference capacitor is compared with a measurement of said first electric field sensor and said first received signal is calibrated responsive to said comparison.

15. A system for detecting an occupant in a vehicle as recited in claim 14, wherein a decision threshold is adapted responsive to said comparison.

16. A system for detecting an occupant in a vehicle as recited in claim 1, wherein said first electric field sensor further comprises at least one third electrode and at least one fourth electrode, wherein said at least one third electrode is located between said at least one first electrode and said at least one fourth electrode, and said at least one third electrode is operatively coupled to a second applied signal.

17. A system for detecting an occupant in a vehicle as recited in claim 16, wherein said at least one third electrode is substantially the same size as said at least one first electrode.

18. A system for detecting an occupant in a vehicle as recited in claim 16, wherein said second applied signal is substantially the same as said first applied signal.

19. A system for detecting an occupant in a vehicle as recited in claim 16, wherein said at least one fourth electrode is located between said at least one first electrode and a foam cushion of said vehicle seat.

20. A system for detecting an occupant in a vehicle as recited in claim 16, wherein said at least one fourth electrode is substantially the same size as said at least one first electrode.

21. A system for detecting an occupant in a vehicle as recited in claim 16, wherein said at least one fourth electrode is operatively connected to a circuit ground.

22. A system for detecting an occupant in a vehicle as recited in claim 16, wherein said at least one fourth electrode is operatively connected to a third applied signal, and said third applied signal is a circuit ground potential.

23. A system for detecting an occupant in a vehicle as recited in claim 1, further comprising a controller operatively coupled to said first electric field sensor and to said second electric field sensor, wherein said controller discriminates responsive to said first received signal the type of object on said vehicle seat and controls the actuation of a safety restraint system responsive thereto.

24. A system for detecting an occupant in a vehicle as recited in claim 23, wherein said controller distinguishes a body part of an occupant seated on said vehicle seat from a body part of an occupant not seated directly on said vehicle from said second received signal, and controls the actuation of a safety restraint system responsive thereto.

25. A system for detecting an occupant in a vehicle as recited in claim 24, wherein said controller disables said safety restraint system if a body part is detected from an occupant not seated directly on said vehicle seat.

26. A system for detecting an occupant in a vehicle as recited in claim 23, wherein said controller disables said safety restraint system if said first electric field sensor senses an occupant seated on said vehicle seat and said second received signal is less than a first threshold.

27. A system for detecting an occupant in a vehicle as recited in claim 23, wherein said controller enables said safety restraint system if said first electric field sensor senses an occupant seated on said vehicle seat and said second received signal is greater than a second threshold.

28. A system for detecting an occupant in a vehicle as recited in claim 23, wherein said controller disables said safety restraint system if said first electric field sensor senses an occupant seated on said vehicle seat and said second received signal is greater than a second threshold for a period of time greater than a third threshold.

29. A system for detecting an occupant in a vehicle as recited in claim 1, further comprising a range/proximity sensor mountable within the seat back of a vehicle seat, wherein said range/proximity sensor when mounted in the seat back of said vehicle seat is responsive to a torso of an occupant proximate to said seat back.

30. A system for detecting an occupant in a vehicle as recited in claim 29, wherein said range/proximity sensor is selected from a third electric field sensor comprising at least one fifth electrode, a capacitive sensor, a radar sensor, an optical range sensor, an active infrared sensor, a passive infrared sensor, a vision sensor, an ultrasonic range sensor, and an inductive sensor.

31. A system for detecting an occupant in a vehicle as recited in claim 29, wherein said range/proximity sensor provides a measure of distance from said seat back to a torso of an occupant.

32. A system for detecting an occupant in a vehicle as recited in claim 29, further comprising a controller operatively coupled to said first electric field sensor and to said second electric field sensor, wherein responsive to said first received signal said controller discriminates the type of object on said vehicle seat and controls the actuation of a safety restraint system responsive thereto and if said second electric field sensor detects an object within an at-risk zone proximate to said safety restraint system then said controller controls the actuation of a safety restraint system responsive to said range/proximity sensor.

33. A system for detecting an occupant in a vehicle, comprising:

a. a means for generating an electric field proximate to a seat bottom of a vehicle seat;

b. a means for sensing an object on said seat bottom of said vehicle seat from the influence of said object on said electric field;

c. a means for sensing said electric field proximate to a safety restraint system;

d. a means for detecting whether an object proximate to a safety restraint system is seated on said vehicle seat from said means for sensing said electric field proximate to a safety restraint system; and e. a means for controlling the actuation of said safety restraint system responsive to said means for sensing an object and responsive to said means for sensing said electric field.

34. A method of detecting an occupant in a vehicle, comprising:

a. generating an electric field proximate to a seat bottom of a vehicle seat;

b. sensing an object on said seat bottom of said vehicle seat from the influence of said object on said electric field;

c. sensing said electric field proximate to a safety restraint system;

d. detecting whether an object proximate to a safety restraint system is seated on said vehicle seat from the sensed electric field proximate to a safety restraint system; and e. controlling the actuation of said safety restraint system responsive to the sensed object and responsive to the sensed electric field.

* * * * *